United States Patent
Tsao et al.

(10) Patent No.: US 8,932,900 B2
(45) Date of Patent: Jan. 13, 2015

(54) PHASE CHANGE MEMORY AND METHOD OF FABRICATING SAME

(75) Inventors: Tsun-Kai Tsao, Yongkang (TW); Ming-Huei Shen, Dounan Town (TW); Shih-Chang Liu, Alian Township, Kaohsiung County (TW); Yeur-Luen Tu, Taichung (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 722 days.

(21) Appl. No.: 13/216,369

(22) Filed: Aug. 24, 2011

(65) Prior Publication Data

US 2013/0048936 A1    Feb. 28, 2013

(51) Int. Cl.
*H01L 21/8239* (2006.01)
*H01L 45/00* (2006.01)

(52) U.S. Cl.
CPC .............. *H01L 45/06* (2013.01); *H01L 45/144* (2013.01); *H01L 45/1683* (2013.01)
USPC ............... 438/102; 438/253; 257/2; 257/200; 257/3; 257/E21.004; 257/E27.004

(58) Field of Classification Search
CPC .... H01L 45/06; H01L 45/1675; H01L 21/768
USPC ...................... 438/102, 253; 257/2, E21.004, 257/E27.004, 200, 3, 4
See application file for complete search history.

(56) References Cited

U.S. PATENT DOCUMENTS

| | | | |
|---|---|---|---|
| 6,894,305 B2 | 5/2005 | Yi et al. | |
| 6,908,812 B2 | 6/2005 | Lowrey | |
| 7,687,794 B2 | 3/2010 | Liu et al. | |
| 2008/0265237 A1 | 10/2008 | Goux et al. | |
| 2009/0280599 A1 | 11/2009 | Im et al. | |
| 2010/0276657 A1 | 11/2010 | Delhougne et al. | |
| 2013/0029456 A1* | 1/2013 | Hunks et al. | 438/102 |

* cited by examiner

*Primary Examiner* — Cathy N Lam
(74) *Attorney, Agent, or Firm* — Haynes and Boone, LLP

(57) ABSTRACT

A fine pitch phase change random access memory ("PCRAM") design and method of fabricating same are disclosed. One embodiment is a phase change memory ("PCM") cell comprising a spacer defining a rectangular reaction area and a phase change material layer disposed within the reaction area. The PCM cell further comprises a protection layer disposed over the GST film layer and within the area defined by the spacer; and a capping layer disposed over the protection layer and the spacer.

20 Claims, 8 Drawing Sheets

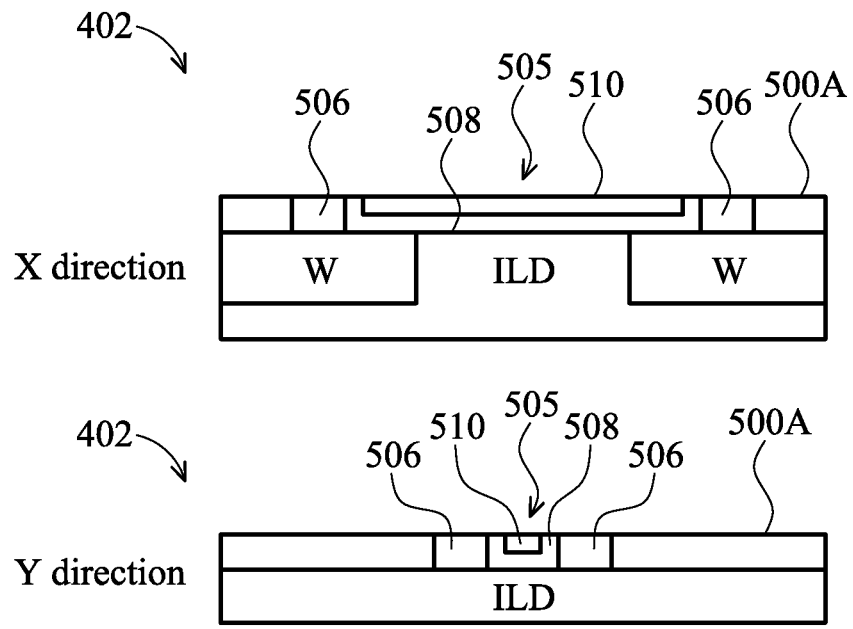
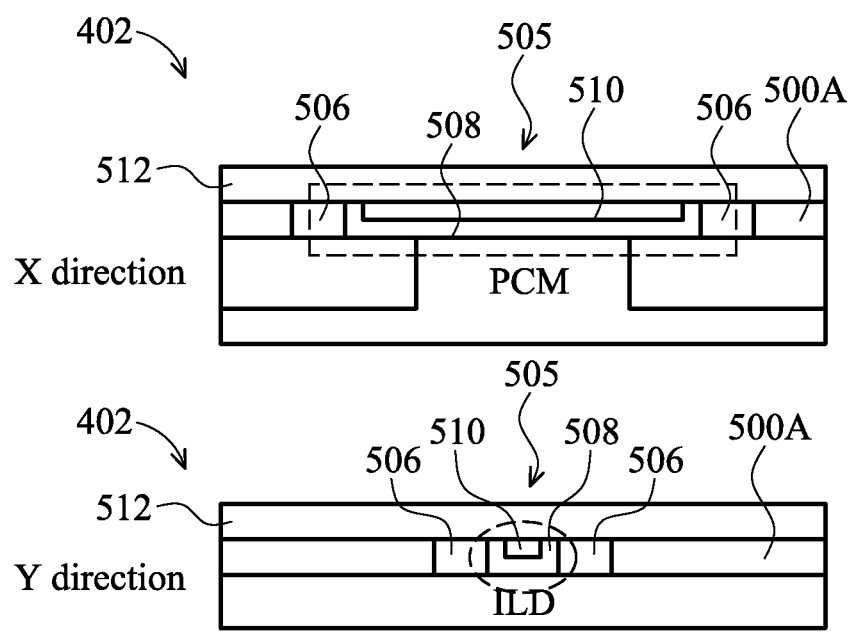
Fig. 5E
Fig. 5F

PHASE CHANGE MEMORY AND METHOD OF FABRICATING SAME

BACKGROUND

Recently, alternative nonvolatile memory devices such as phase change random access memory (PCRAM) devices, magnetic random access memory (MRAM) devices and ferroelectric random access memory (FRAM) devices having cell structures similar to those of DRAM devices, have been proposed and are being developed. A memory cell of a PCRAM generally includes a phase change element comprised of a chalcogenide alloy such as germanium antimony tellurium ("Este" or "GST"), for example, and a structure such as a transistor or other device that applies current to the phase change element ("PCE"). In one embodiment, one source/drain of the transistor may be coupled to ground with the other source/drain coupled to the PCE and the transistor gate coupled to a gate voltage. Another portion of the PCE may be coupled to a bit line voltage. According to this embodiment, when the data stored within the PCE is to be accessed, a voltage is applied to turn on the transistor and the bit line voltage is applied to the phase change material such that a read current may flow through the PCE and the transistor. Based on the level of output current, the data stored within the PCE is accessed.

Using the aforementioned arrangement or other arrangements, the level of output current depends upon the phase and impedance of the phase change material. By changing the phase of a phase change material such as from amorphous to crystalline or vice versa, the impedance of the phase change material may dramatically change. The changing impedance of the phase change material enables the phase change material to store different data. For example, the low-impedance form of the phase change material may store a data value of "1" whereas the high impedance form of the phase change material may store a data value of "0."

There is ever-increasing pressure to reduce the size of the reaction, or contact, area of PCRAM cells. This is due to both increasing pressure to reduce the overall size of the cell, as well as the fact that a smaller reaction area results in a faster memory cell. Additionally, the process currently used to fabricate PCRAM cells can induce voids in the GST layer due to poor sealing layer coverage resulting in outgassing of the GST at high temperatures. In particular, poor step coverage will induce voids in the GST layer and will worsen outgassing when high temperatures (e.g., greater than 250° C.) are applied at the back end of the fabrication process.

Based on the foregoing, what is needed are PCRAM structures and methods for fabricating same that have smaller reaction areas and that do not suffer the GST void-inducing outgassing problems prevalent in current fabrication methods.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 5A-5F collectively illustrate a method of fabricating a PCM cell in accordance with embodiments described herein.

DETAILED DESCRIPTION

Figure 1:
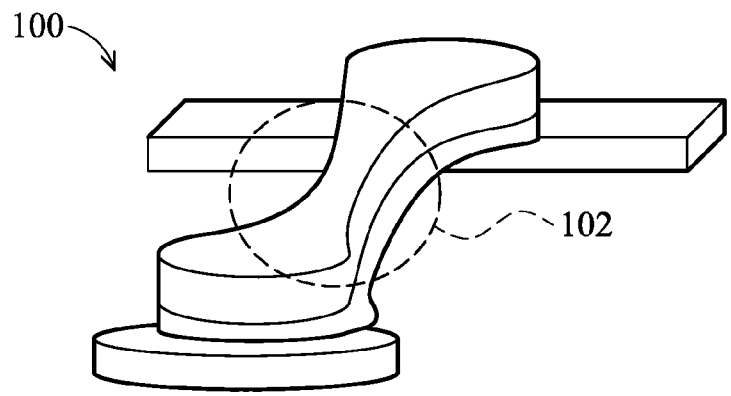
FIG. 1 illustrates an embodiment of a phase change memory ("PCM") cell.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 2:
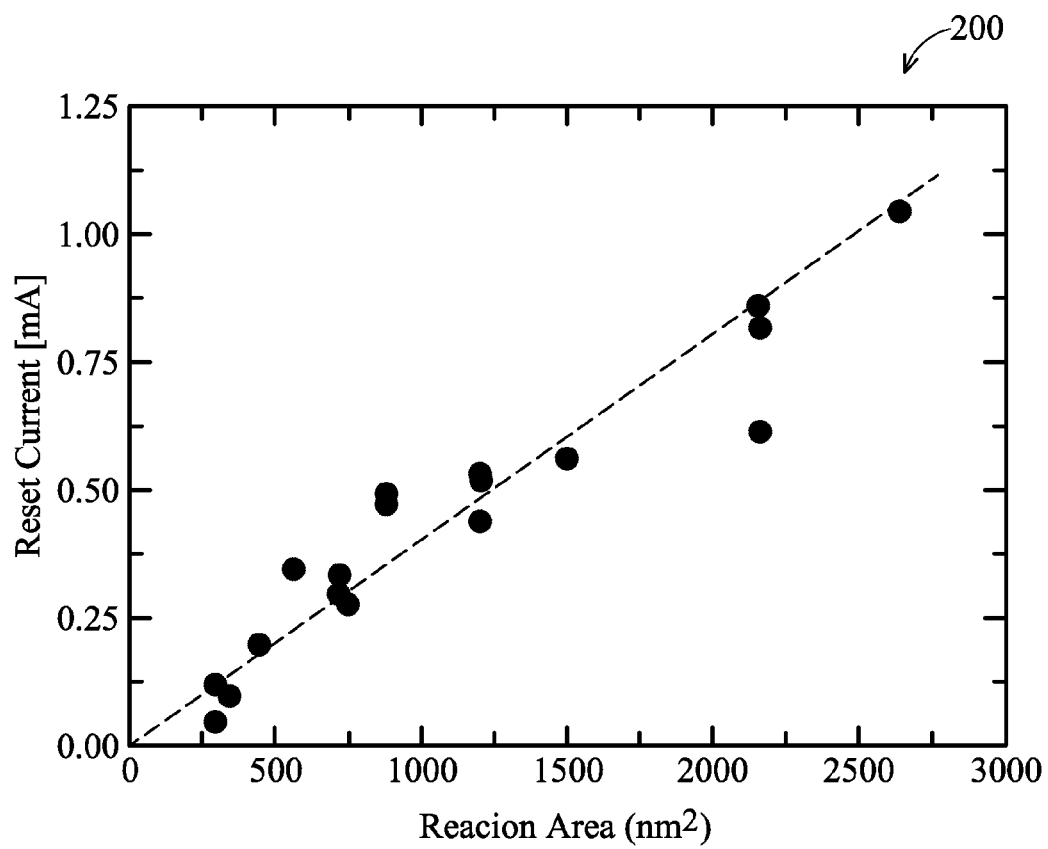
FIG. 2 is a graph showing a relationship between PCM cell reaction area and reset current.

FIG. 1 illustrates a PCRAM cell 100 according to one or more embodiments of the present disclosure. The PCRAM cell 100 includes a reaction area, or contact area, generally designated by a reference numeral 102. The reaction area correlates to a reset current of the PCRAM cell 100. Referring to FIG. 2, a graph 200 illustrates an example correlation between the reaction area (in $nm^2$) of a PCRAM cell and the reset current (in mA). As is apparent from the graph 200, as the size of the reaction area of a PCRAM cell increases, so does the corresponding reset current; therefore, one way to reduce the amount of current required to reset the cell is to decrease its reaction area. Other pressure to reduce the size of the reaction area originates from the fact that the critical dimension ("CD") for an N65 generation PCRAM is 50 nm; the CD for the next generation (N45) PCRAM will be 30 nm.

Additionally, as previously noted, GST films easily outgases at temperatures higher than 250° C.; therefore, poor step coverage caused by prior art fabrication techniques will induce voids in the GST layer and worsen outgassing when higher temperatures are applied at the back end during deposition of other layers, such as ILD and LK.

Figure 3A:
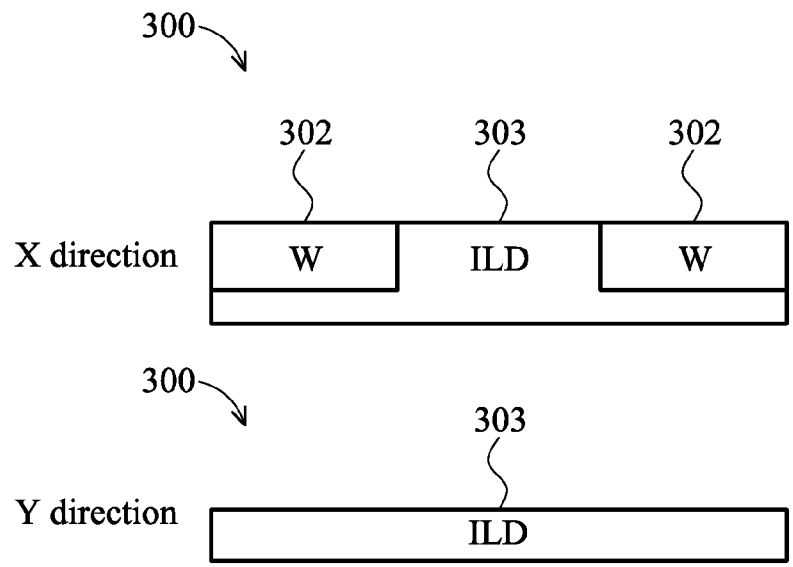
FIGS. 3A-3D collectively illustrate a method of fabricating a PCM cell in accordance with prior art embodiments.
Figure 3B:
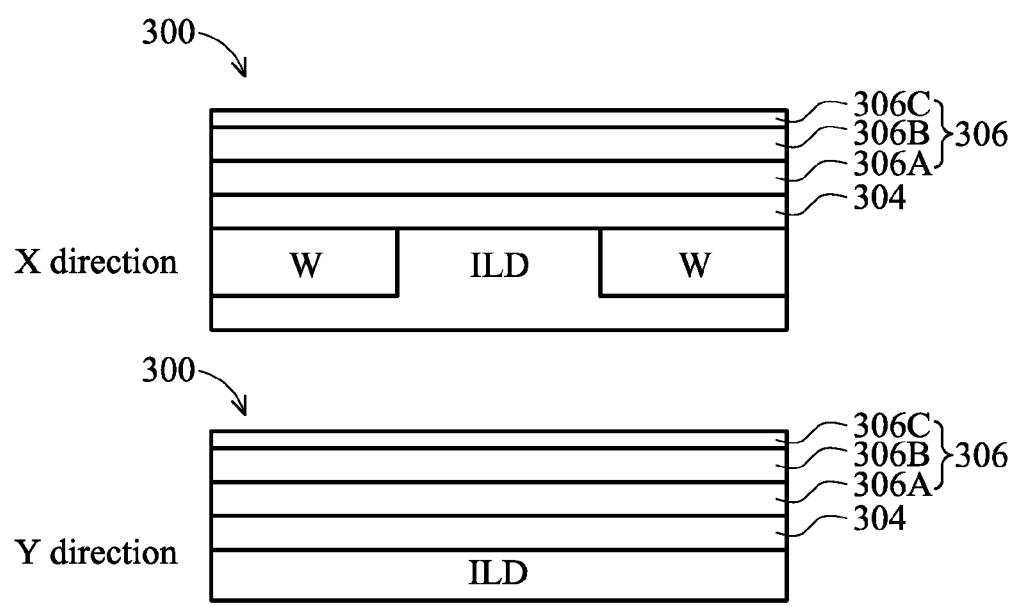

FIGS. 3A-3D illustrate a conventional PCRAM cell, and a method of fabrication, represented in the figures by a cell portion 300. FIG. 3A illustrates the cell portion 300 comprising a pair of electrodes 302, which may comprise tungsten ("W"), disposed on an interlayer dielectric ("ILD") layer 303, after the surface of the cell portion has been planarized via chemical mechanical polish ("CMP") process, for example. FIG. 3B illustrates the cell portion 300 after a phase change material layer 304 and a hard mask ("HM") 306 have been deposited in a conventional manner. In one embodiment, the phase change material layer 304 comprises a germanium antimony tellurium ("Este" or "GST") film having a thickness of approximately 200 Å, while the HM layer 306 comprises a silicon nitride ("SiN") layer 306A having a thickness of approximately 300 Å, an oxide layer 306B having a thickness of approximately 200 Å, and a silicon oxynitride ("SiON") layer 306C having a thickness of approximately 400 Å.

Figure 3C:
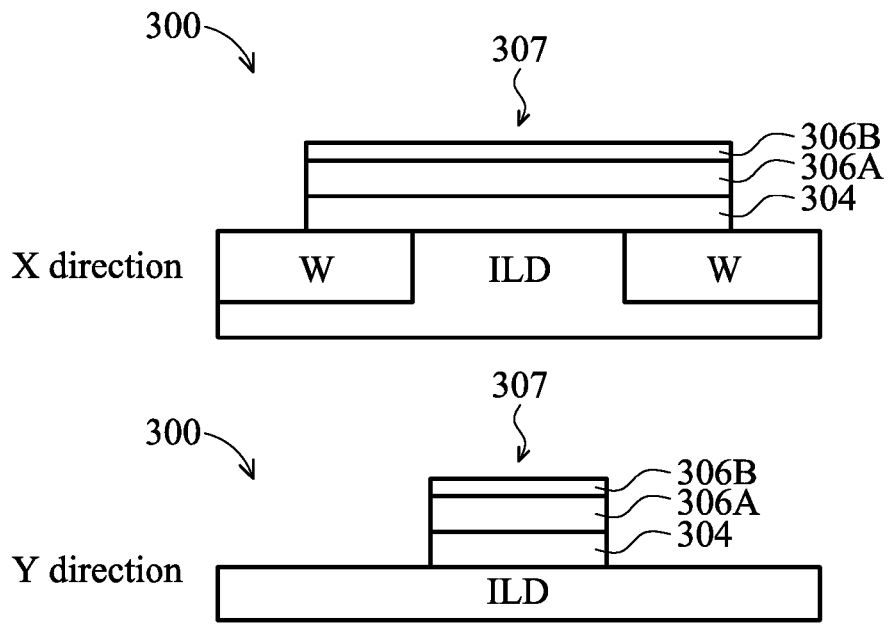
Figure 3D:
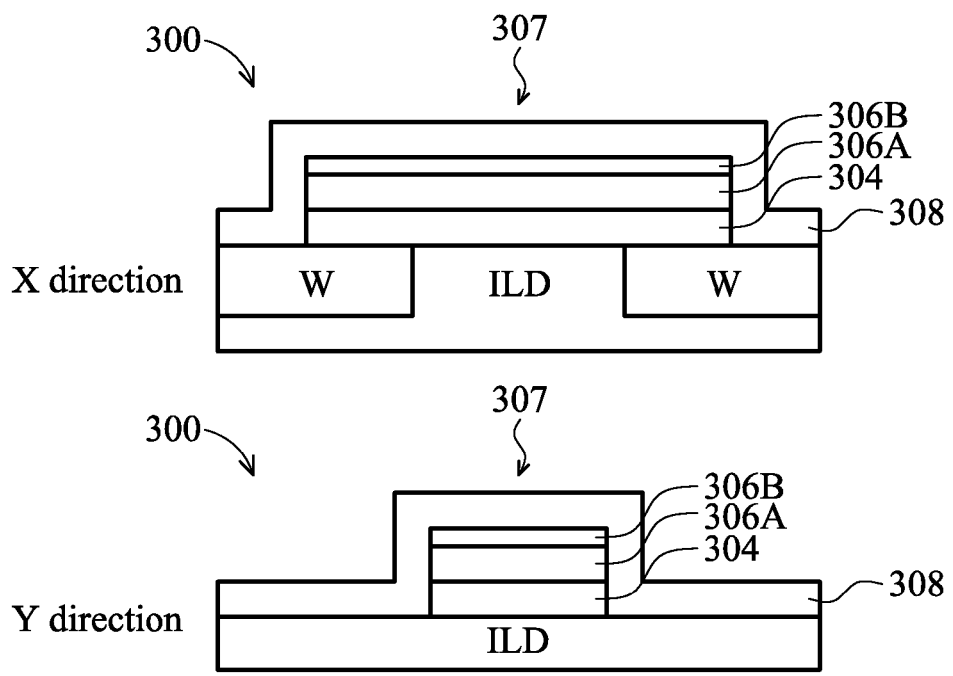

FIG. 3C illustrates the cell portion 300 after the layers 304, 306A, 306B, 306C, have been etched to form a reaction area 307. Finally, FIG. 3D illustrates the cell portion 300 after deposition of a sealing layer 308, comprising an SiN layer having a thickness of approximately 400 Å.

Figure 4A:
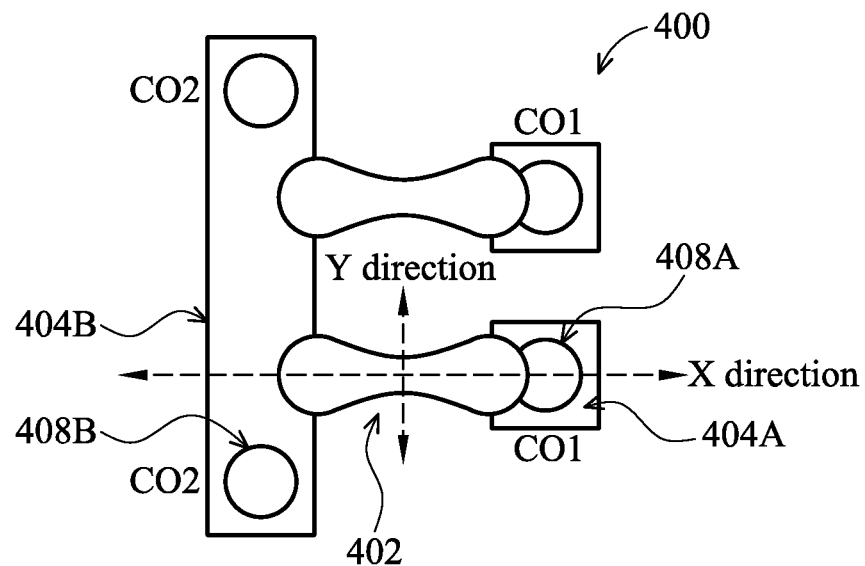
FIGS. 4A and 4B collectively illustrate a PCM cell arrangement in accordance with embodiments described herein.
Figure 4B:
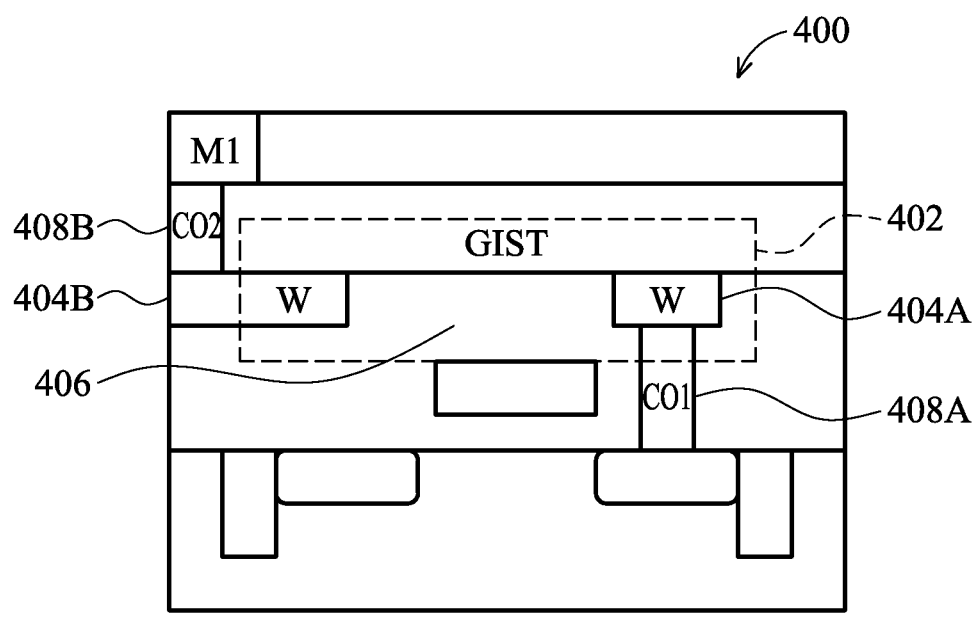

FIGS. 4A-4B illustrate an arrangement 400 with a embodiment of a PCRAM cell 402 fabricated in accordance with features of this disclosure described herein. FIG. 4A illustrates a top view of the arrangement 400 of the PCRAM cell 402. FIG. 4B is a cross-sectional view obtained from the vertical plane along X-direction in FIG. 4A. FIGS. 5A-5F illustrate fabrication of the cell 402. As shown in FIGS. 4A and 4B, a pair of electrodes 404A, 404B, which may be comprised of W, are disposed in an ILD 406. As best illustrated in FIG. 4A, a first conductor 408A is disposed beneath the electrode 404A, while a second conductor 408B is disposed above the electrode 404B in a manner that is offset from the cell 402.

Figure 5A:
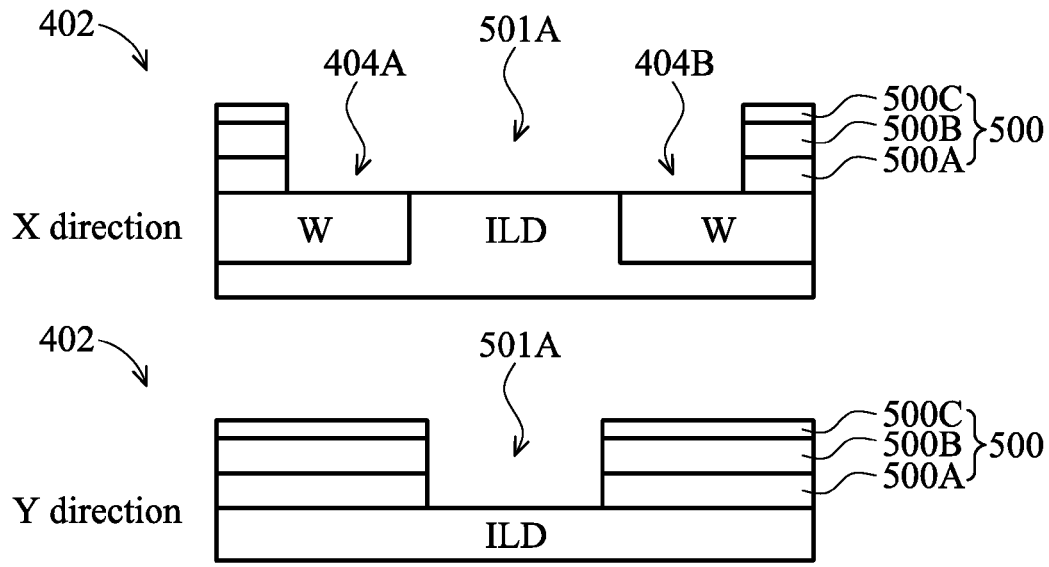

FIG. 5A illustrates the cell 402 after deposition of a hard mask (HM) 500, which comprises a SiN layer 500A having a thickness of between 100 and 500 Å. In one embodiment, the thickness is approximately 300 Å. The HM 500 also includes an oxide layer 500B having a thickness of between 100 and 500 Å. In one embodiment, the thickness is approximately 200 Å. The HM 500 also includes a SiON layer 500C having a thickness of between 100 and 500 Å. In one embodiment, the thickness is approximately 400 Å. The opening 501A in the HM 500 is formed by a lithography process, after which is performed a dielectric etch process. The remaining HM 500 defines the outer edge of the cell 402. The opening 501A exposes portions of the electrodes 404A and 404B and the ILD layer 106 between the electrodes 404A and 404B.

Figure 5B:
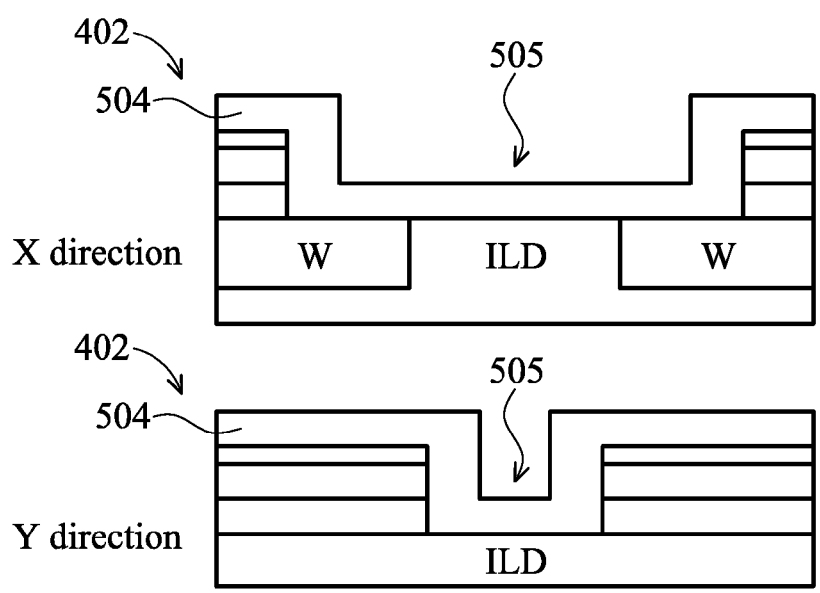

FIG. 5B illustrates the cell 402 after a spacer layer 504 has been deposited over the opening 501A and the remaining HM 500. In one embodiment, the spacer layer 504 comprises one of SiN, SiO$_2$, or SiON having a thickness in the range of approximately 100 Å to 500 Å, depending on the CD of the cell 402, and defines a reaction area 505 of the cell 402.

Figure 5C:
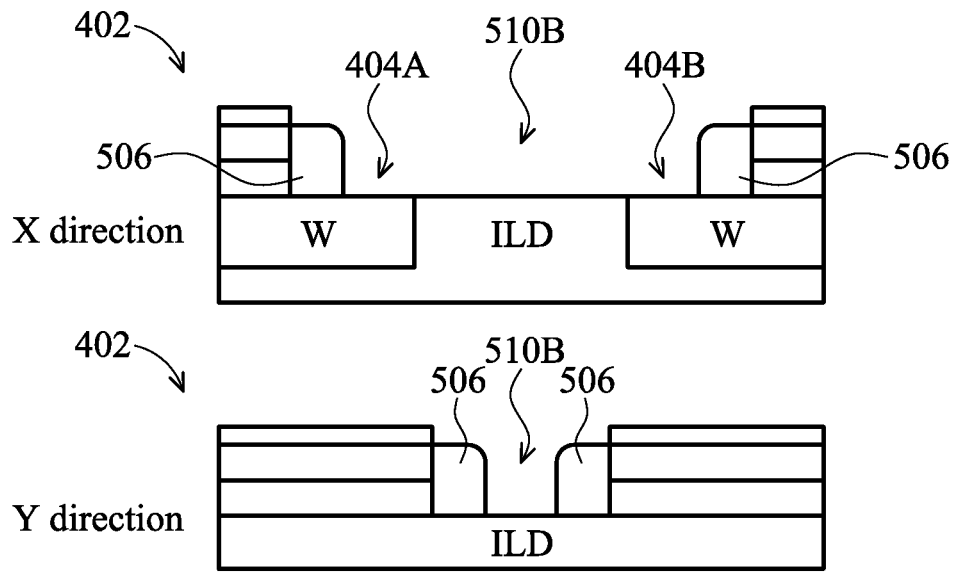

FIG. 5C illustrates the cell 402 after isotropic etching of the spacer layer 504 to create a spacer 506 along the sidewalls of the remaining HM 500. The spacer 506 covers a portion of the exposed the electrodes 404A and 404B shown in FIG. 5A. The spacer 506 serves the purpose of reducing the dimension of the reaction area without adding lithography upgrade. The opening 501A is then further shaped to create a smaller opening 501B. In the present embodiment, the width of the spacer 506 is fairly close to the thickness of the spacer layer 504; i.e., in the range of approximately 100 Å to 500 Å.

Figure 5D:
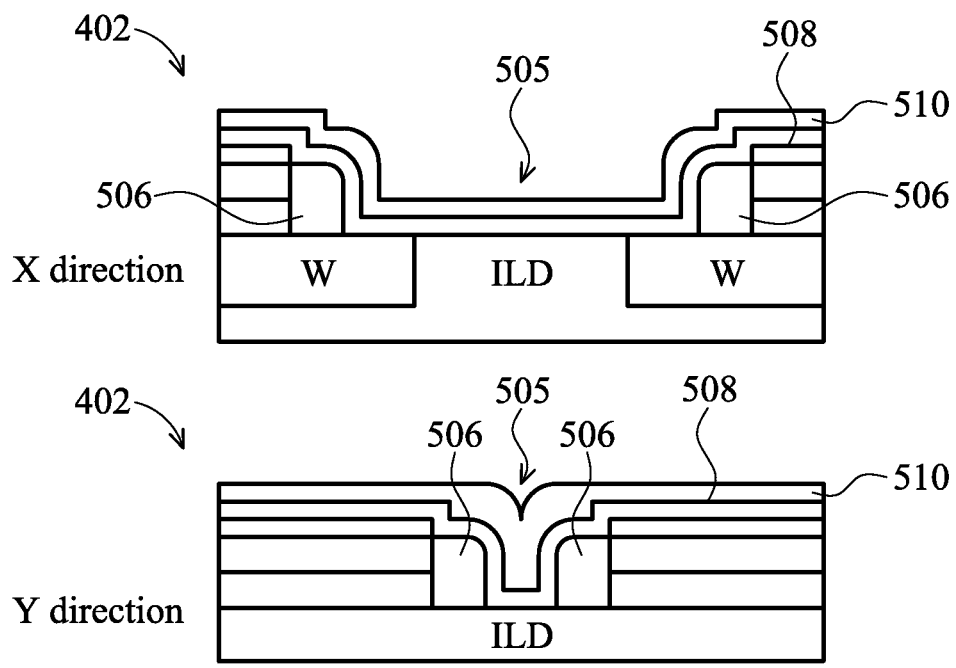

FIG. 5D illustrates the cell 402 after deposition of a phase change material (PCM) layer 508, which in one embodiment comprises a GST (GeSbTe) film. The phase change material layer 508 is formed over the opening 501B, the spacer 506, and the remaining HM 500. The GST film may have a thickness of between 100 and 500 Å. In one embodiment, the thickness is approximately 200 Å. A protection layer 510 is deposited on top of PCM layer 508. The protection layer may comprise SiN or SiO$_2$ having a thickness in the range of approximately 200 Å to 500 Å.

FIG. 5E illustrates the cell 402 following a performance of a chemical mechanical polishing (CMP) process, which is controlled to stop on one of the HM layers, i.e., the SiN layer 500A. The depth of CMP polishing is determined by the remaining thickness of SiN, which in one embodiment is approximately 500 Å. After the CMP process, the cell 402 has a planarized topography. The reaction area 505 of the cell 402 is defined by the spacer 506. The PCM layer 508 is disposed within the reaction area 505. The protection layer 510 is disposed over the PCM layer 508 and within the reaction area 505 defined by the spacer 506.

FIG. 5F illustrates the cell 402 after a capping layer 512 is deposited on top of planarized cell 402 to establish a top seal for the cell. The capping layer 512 may comprise SiN. The thickness of the capping layer 512 may be between about 400 Å and 1000 Å. The thickness of the capping layer may be selected to ensure sufficient encapsulation, but still allow for a wide process window.

A PCRAM cell fabricated in accordance with the method illustrated in FIGS. 5A-5F, such as the cell 402, may be fabricated to achieve relatively small critical dimensions without requiring advanced lithography processes and/or tools to shrink the CD of the PCRAM cell. Moreover, the method illustrated in FIGS. 5A-5F avoids the step coverage problem, especially at foot of the steps, which results in induction of GST void and outgassing during the high temperature processes that may occur during other processes.

Figure 6:
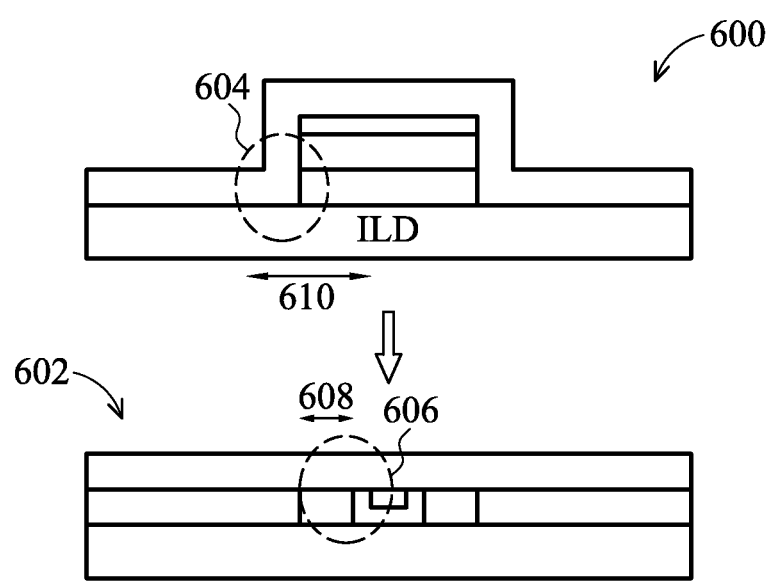
FIG. 6 illustrates a comparison between a PCM cell fabricated in accordance with the method of FIGS. 3A-3D and a PCM cell fabricated in accordance with the method of FIGS. 5A-5F.

FIG. 6 illustrates a comparison between a PCM cell fabricated in accordance with the method illustrated in FIGS. 3A-3D, represented by a cell 600, and a PCM cell fabricated in accordance with them method illustrated in FIGS. 5A-5F, represented by a cell 602. In particular, as shown in FIG. 6, in cell 600 the reaction area structure is formed as a step shape, which presents the challenge of providing good step coverage by the capping layer. This is primarily due to GST outgassing that occurs during the subsequent high temperature process. The poor capping layer coverage at the foot of the step 604 is of particular concern. In contrast, in the cell 602 the reaction area is formed to have a planar topography, thereby insuring good capping layer coverage. Moreover, the dimension of the actual reaction area of the cell 602 is reduced, due to the addition of the spacer structure within the reaction area.

Accordingly, the present disclosure describes a phase chang memory ("PCM") cell. In one embodiment, the PCM cell comprises a spacer defining a rectangular reaction area and a phase change material layer disposed within the reaction area. The PCM cell further comprises a protection layer disposed over the GST film layer and within the area defined by the spacer; and a capping layer disposed over the protection layer and the spacer.

The present disclosure also describes a method of fabricating a phase change memory ("PCM") device comprising an interlayer dielectric ("ILD") layer having electrodes disposed at opposite ends thereof. The method comprises defining a first rectangular area on a top surface of the ILD layer using a hard mask; creating a spacer along an inner edge of the hard mask layer and an outer edge of the first rectangular area to define a second rectangular area; and depositing a phase change material layer within the second rectangular area. The method further comprises depositing a protection layer over the phase change material layer; performing a chemical mechanical polish ("CMP") process to isolate the phase change material layer; and depositing a capping layer over the device.

Yet another embodiment is a method of fabricating a phase change memory ("PCM") device comprising an interlayer dielectric ("ILD") layer having electrodes disposed at opposite ends thereof. The method comprises defining a first rectangular area on a top surface of the ILD layer using a hard mask by depositing at least one layer comprising the hard mask on the ILD layer; and etching the hard mask to create the first rectangular area, wherein the at least one layer comprising the hard mask comprises an outer boundary of the first rectangular area. The method further comprises creating a spacer along an inner edge of the hard mask layer and an outer edge of the first rectangular area to define a second rectangular area by depositing a spacer layer; and etching the spacer layer to create the spacer. The method further comprises depositing a phase change material layer within the second rectangular area; depositing a protection layer over the phase change material layer; performing a CMP process on a top surface of the device to isolate the phase change material layer, the method further comprising stopping the CMP process a designated layer of the HM; and depositing a capping layer over the device.

Although only a few exemplary embodiments of this invention have been described in detail above, those skilled in the art will readily appreciate that many modifications are possible in the exemplary embodiments without materially departing from the novel teachings and advantages of this invention. In particular, different materials may be substituted for the materials mentioned herein; for example, chalcogenide films other than GST may be used to implement the phase change material.

It is understood that various different combinations of the above-listed embodiments and steps can be used in various sequences or in parallel, and there is no particular step that is critical or required. Moreover, each of the modules depicted in the drawings can be implemented on multiple devices, including computing devices, and implementation of multiple ones of the depicted modules may be combined into a single device, including a computing device. Furthermore, features illustrated and discussed above with respect to some embodiments can be combined with features illustrated and discussed above with respect to other embodiments. Accordingly, all such modifications are intended to be included within the scope of this invention.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a phase change memory ("PCM") device comprising an interlayer dielectric ("ILD") layer having electrodes disposed at opposite ends thereof, the method comprising:

defining a first area on a top surface of the ILD layer using a hard mask;
creating a spacer along an inner edge of the hard mask layer and an outer edge of the first area to define a second area;
depositing a phase change material layer within the second area;
depositing a protection layer over the phase change material layer;
isolating the phase change material layer; and
depositing a capping layer over the device.

2. The method of claim 1 wherein the defining comprises:
depositing at least one layer comprising the hard mask on the ILD layer; and
etching the hard mask to create the first area, wherein the at least one layer comprising the hard mask comprises an outer boundary of the first area.

3. The method of claim 2 wherein the depositing at least one layer comprising the hard mask comprises depositing at least one of an SiN layer, an oxide layer, and an SiON layer over the ILD layer, such that a total thickness of the hard mask layer is in a range of approximately 500 Å-2000 Å.

4. The method of claim 2 wherein the depositing at least one layer comprising the hard mask comprises:
depositing an SiN layer on the ILD layer, the SiN layer having a thickness of approximately 100 Å-500 Å;
depositing an oxide layer on the SiN layer, the oxide layer having a thickness of approximately 100 Å-500 Å; and
depositing an SiON layer on the oxide layer, the SiON layer having a thickness of approximately 200 Å-500 Å.

5. The method of claim 1 wherein the creating a spacer comprises:
depositing a spacer layer; and
etching the spacer layer to create the spacer.

6. The method of claim 5 wherein the spacer comprises one of SiN, SiO2, and SiON and has a thickness of approximately 100 Å-500 Å.

7. The method of claim 1 wherein the isolating the phase change material layer comprises performing a chemical mechanical polish ("CMP") process on a top surface of the device, the method further comprising stopping the CMP process at a designated layer of the hard mask.

8. The method of claim 1 wherein the depositing a protection layer comprises depositing a layer of SiN or SiO2 having a thickness of approximately 200 Å-500 Å.

9. The method of claim 1 wherein the depositing a capping layer comprises depositing a layer of SiN having a thickness of approximately 400 Å-1000 Å.

10. A method of fabricating a phase change memory ("PCM") device comprising an interlayer dielectric ("ILD") layer having electrodes disposed at opposite ends thereof, the method comprising:

defining a first rectangular area on a top surface of the ILD layer using a hard mask, the defining comprising:
depositing at least one layer comprising the hard mask on the ILD layer; and
etching the hard mask to create the first rectangular area, wherein the at least one layer comprising the hard mask comprises an outer boundary of the first rectangular area;
creating a spacer along an inner edge of the hard mask layer and an outer edge of the first rectangular area to define a second rectangular area, the creating comprising:
depositing a spacer layer; and
etching the spacer layer to create the spacer;
depositing a phase change material layer within the second rectangular area;

depositing a protection layer over the phase change material layer;

performing a CMP process on a top surface of the device to isolate the phase change material layer, the method further comprising stopping the CMP process at a designated layer of the hard mask; and depositing a capping layer over the device.

11. The method of claim 10 wherein the depositing at least one layer comprising the hardmask comprises:

depositing an SiN layer on the ILD layer, the SiN layer having a thickness of approximately 3×10² Å;

depositing an oxide layer on the SiN layer, the oxide layer having a thickness of approximately 2×10² Å; and depositing an SiON layer on the oxide layer, the SiON layer having a thickness of approximately 4×10² Å;

wherein the designated layer is the SiN layer.

12. The method of claim 10 wherein the spacer comprises one of SiN, SiO2, and SiON and has a thickness of approximately 100 Å-500 Å.

13. A method of fabricating a phase change memory device comprising an interlayer dielectric ("ILD") layer having electrodes disposed at opposite ends thereof, the method comprising:

forming a spacer to define a reaction area;

disposing a phase change material (PCM) layer within the reaction area;

disposing a protection layer over the PCM layer and within the reaction area defined by the spacer; and disposing a capping layer over the protection layer and the spacer.

14. The method of claim 13 further comprising forming an electrode underneath one end of the reaction area.

15. The method of claim 13 further comprising forming a stop layer along an outer edge of the spacer.

16. The method of claim 13 wherein the spacer comprises at least one of SiN, SiO2, and SiON and has a thickness in a range of approximately 100 Å-500 Å.

17. The method of claim 13 wherein the phase change material comprises a GeSbTe alloy film.

18. The method of claim 13 wherein the protection layer comprises one of SiN and SiO2 and has a thickness in a range of 200 Å-500 Å.

19. The method of claim 13 wherein the capping layer comprises SiN and has a thickness in a range of 400 Å-1000 Å.

20. The method of claim 14 further comprising forming a conductor below and in contact with the electrode.

* * * * *